United States Patent
Kurashima et al.

(10) Patent No.: US 7,825,028 B2
(45) Date of Patent: Nov. 2, 2010

(54) METHOD OF MANUFACTURING SEMICONDUCTOR DEVICE

(75) Inventors: Nobuyuki Kurashima, Yokohama (JP);
Gaku Minamihaba, Yokohama (JP);
Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 12/289,271

(22) Filed: Oct. 23, 2008

(65) Prior Publication Data

US 2009/0061626 A1 Mar. 5, 2009

Related U.S. Application Data

(63) Continuation of application No. 11/142,235, filed on Jun. 2, 2005, now abandoned.

(30) Foreign Application Priority Data

Jul. 16, 2004 (JP) ............................. 2004-210180

(51) Int. Cl.
*H01L 21/302* (2006.01)
(52) U.S. Cl. ................. 438/692; 438/750; 257/E21.23; 257/E21.304
(58) Field of Classification Search ................. 438/618, 438/675, 692, 700, 714, 750, 959; 257/E21.224, 257/E21.23, E21.304
See application file for complete search history.

(56) References Cited

U.S. PATENT DOCUMENTS 5,466,389 A * 11/1995 Ilardi et al. .................. 510/175
6,723,631 B2 * 4/2004 Noguchi et al. ............. 438/618

2004/0147127 A1   7/2004 Noguchi et al.

FOREIGN PATENT DOCUMENTS

| JP | 8-107094 | 5/1994 |
|---|---|---|
| JP | 08-250455 A | 9/1996 |
| JP | 2001-196339 | 7/2001 |
| JP | 2002-079190 A | 3/2002 |
| JP | 2002-359223 | 12/2002 |

(Continued)

OTHER PUBLICATIONS

Notice of Reasons For Rejections mailed Jan. 27, 2009 in counterpart Japanese Patent Application No. 2004-210180, and English language translation thereof.

(Continued)

*Primary Examiner*—Quoc D Hoang
(74) *Attorney, Agent, or Firm*—Finnegan, Henderson, Farabow, Garrett & Dunner, L.L.P.

(57) ABSTRACT

Disclosed is a method for manufacturing a semiconductor device comprising forming a hydrophobic interlayer insulating film having a relative dielectric constant of 3.5 or less above a semiconductor substrate, forming a recess in the interlayer insulating film, depositing a conductive material above the interlayer insulating film having the recess to form a conductive layer, selectively removing the conductive material deposited above the interlayer insulating film by polishing to expose a surface of the interlayer insulating film while leaving the conductive material in the recess, and subjecting the surface of the interlayer insulating film having the recess filled with the conductive material to pressure washing using a resin member and an alkaline washing liquid containing an inorganic alkali and exhibiting a pH of more than 9.

19 Claims, 3 Drawing Sheets

FOREIGN PATENT DOCUMENTS

| | | |
|---|---|---|
| JP | 2003-179020 A | 6/2003 |
| JP | 2003-289060 A | 10/2003 |
| JP | 2004-22855 | 1/2004 |

OTHER PUBLICATIONS

English language Patent Abstract of JP 08-250455.

English language Patent Abstract of JP 2002-079190.

English language Patent Abstract of JP 2003-179020.

English language Patent Abstract of JP 2003-289060.

Decision of Rejection mailed Jul. 14, 2009, from the Japanese Patent Office in corresponding Japanese Patent Application No. 2004-210180, and English language translation thereof.

* cited by examiner

METHOD OF MANUFACTURING SEMICONDUCTOR DEVICE

CROSS-REFERENCE TO RELATED APPLICATIONS

This is a continuation of application Ser. No. 11/142,235, filed Jun. 2, 2005 now abandoned, which is based upon and claims the benefit of priority from prior Japanese Patent Application No. 2004-210180, filed Jul. 16, 2004, the entire contents of both of which are incorporated herein by reference.

BACKGROUND OF THE INVENTION

1. Field of the Invention

This invention relates to a method of manufacturing a semiconductor device, and in particular, to a method of manufacturing a semiconductor device having a damascene wiring wherein a conductive material is buried in a low dielectric constant insulating film.

2. Description of the Related Art

In the manufacturing process of a semiconductor device, it has been necessary, in order to remove fine particles adhering to the semiconductor substrate, to employ physical washing means together with chemical washing means. However, it has been impossible to reliably remove fine particles when the fine particles include very fine particles.

Under the circumstances, it has been proposed to employ an inorganic alkaline solution in order to remove abrasive particles from the surface of a Cu film after the Cu film has been buried in an insulating film by chemical mechanical polishing (CMP). Since CuO generated on the surface of a Cu film as a result of the polishing process of a Cu film, an electrostatic repulsive force generated between the CuO and the abrasive particles when an inorganic alkaline solution is sprayed onto the Cu film. As a result, the abrasive particles are prevented from adhering to the CuO layer.

Further, there has also been proposed a washing method using an organic alkaline washing liquid for washing a semiconductor substrate after the process of CMP for burying a conductive member made of Cu or a Cu alloy in an insulating film. Since an organic acid is included in a polishing material composition to be employed in the CMP, a layer of copper complex is formed on the surface of the conductive member due to the effect of this organic acid. Since this copper complex can be readily washed with the employment of an organic alkaline washing liquid, there is little possibility of damaging the buried wiring.

As for the interlayer insulating film in which a Cu film is to be buried, there have been conventionally employed a TEOS film, a silicon oxide film, a boro-phospho silicate glass film (BPSG film), a phospho silicate glass film (PSG film), etc. Recently, a low dielectric constant insulating film (a low-k insulating film) having a relative dielectric constant of 3.5 or less has been employed as an interlayer insulating film. This low-k film however is lower in mechanical strength than the materials that have been conventionally employed as an interlayer insulating film. Further, when the conventional washing method is applied to the low-k film in order to remove the fine particles adhering to the surface of Cu film, new defects may form on the surface of Cu film, resulting in reduced yield.

BRIEF SUMMARY OF THE INVENTION

A method for manufacturing a semiconductor device according to one aspect of the present invention comprises forming a hydrophobic interlayer insulating film having a relative dielectric constant of 3.5 or less above a semiconductor substrate; forming a recess in the interlayer insulating film; depositing a conductive material above the interlayer insulating film having the recess to form a conductive layer; selectively removing the conductive material deposited above the interlayer insulating film by polishing to expose a surface of the interlayer insulating film while leaving the conductive material in the recess; and subjecting the surface of the interlayer insulating film having the recess filled with the conductive material to pressure washing using a resin member and an alkaline washing liquid containing an inorganic alkali and exhibiting a pH of more than 9.

A method for manufacturing a semiconductor device according to another aspect of the present invention comprises forming a hydrophobic interlayer insulating film having a relative dielectric constant of 3.5 or less above a semiconductor substrate; forming a recess in the interlayer insulating film; depositing a conductive material above the interlayer insulating film having the recess to form a conductive layer; contacting the semiconductor substrate having the conductive layer formed thereabove with a polishing pad, thereby selectively removing the conductive material deposited above the interlayer insulating film by polishing, thus exposing a surface of the interlayer insulating film while leaving the conductive material in the recess; and slide-contacting the surface of the interlayer insulating film having the recess filled with the conductive material to the polishing pad while pressing the semiconductor substrate against the polishing pad and feeding an alkaline solution containing an inorganic alkali and exhibiting a pH of more than 9 to the polishing pad.

A method for manufacturing a semiconductor device according to a further aspect of the present invention comprises forming a hydrophobic interlayer insulating film having a relative dielectric constant of 3.5 or less above a semiconductor substrate; forming a recess in the interlayer insulating film; depositing a conductive material above the interlayer insulating film having the recess to form a conductive layer; contacting the semiconductor substrate having the conductive layer formed thereabove with a polishing pad, thereby selectively removing the conductive material deposited above the interlayer insulating film by polishing, thus exposing a surface of the interlayer insulating film while leaving the conductive material in the recess; and subjecting the surface of the interlayer insulating film having the recess filled with the conductive material to pressure washing using a roll having at least resinous surface and an alkaline washing liquid containing an inorganic alkali and exhibiting a pH of more than 9.

DETAILED DESCRIPTION OF THE INVENTION

Next, the embodiments of the present invention will be explained with reference to the drawings.

FIGS. 1 to 5 are cross-sectional views each illustrating, stepwise, the method of manufacturing a semiconductor device according to one embodiment of the present invention.

Figure 1:
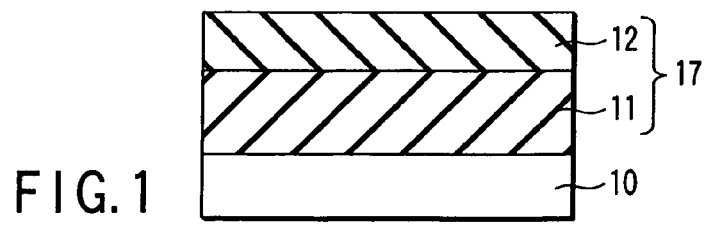
FIG. 1 is a cross-sectional view illustrating one step in the method of manufacturing a semiconductor device according to one embodiment of the present invention.
Figure 2:
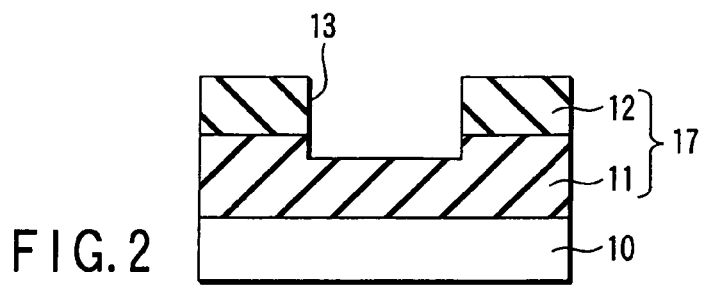
FIG. 2 is a cross-sectional view illustrating the step following the step shown in FIG. 1.

As shown in FIG. 1, an interlayer insulating film 17 is deposited on a semiconductor substrate 10 in which semiconductor elements (not shown) are formed. With respect to the configuration of this interlayer insulating film 17, there is not particular limitation as long as the relative dielectric constant thereof is confined to 3.5 or less and the surface thereof is hydrophobic, so that this interlayer insulating film 17 may be formed of a single-layer structure or a laminate structure. In order to secure a sufficiently high density to withstand CMP and also to secure low dielectric constant, the relative dielectric constant of the interlayer insulating film is confined to 3.5 or less. Incidentally, the determination of whether the surface of the film is hydrophilic or hydrophobic is performed as follows by dipping the substrate having the film into pure water for 30 seconds. Namely, if the surface of the film remains wet for 10 seconds after the substrate is pulled out of the pure water, the surface is determined as hydrophilic. On the contrary, if the pure water is repelled from the surface of the film within 10 seconds of the substrate being pulled out of the pure water, the surface is determined as hydrophobic. In the embodiment shown in the drawings, a second insulating film 12 which has a relative dielectric constant of 3.5 or less and is hydrophobic is deposited on a first insulating film 11 formed of a low dielectric constant material (low-k material) and exhibiting less than 2.5 in relative dielectric constant to construct the interlayer insulating film 17. Although the first insulating film 11 may not be sufficiently high in mechanical strength, it is possible to sufficiently decrease the relative dielectric constant of the interlayer insulating film as a whole.

As for the first insulating film 11, it is possible to employ, for example, at least one selected from the group consisting of a porous hydrogen silsesquioxane (HSQ)-based material, a porous methyl silsesquioxane (MSQ)-based material, and a porous organic material.

As for the porous HSQ-based material, specific examples include, for example, XLK (Dow Corning Corp.), the relative dielectric constant thereof being 2 to 2.2; OCL T-72 (Tokyo Ohka Kogyo Co., Ltd.), the relative dielectric constant thereof being 1.9 to 2.2; Nanoglass (Honeywell Electronic Materials), the relative dielectric constant thereof being 1.8 to 2.2; and MesoELK (Air Products and Chemicals, Inc.), the relative dielectric constant thereof being 2 or less.

As for the porous MSQ-based material, specific examples include, for example, LKD-5109 (JSR), the relative dielectric constant thereof being 2.0 to 2.4; HSG-6211X (Hitachi Chemical Co. Ltd), the relative dielectric constant thereof being 2.4; ALCAP-S (Asahi Chemical Industry Co., Ltd), the relative dielectric constant thereof being 1.8 to 2.3; OCL T-77 (Tokyo Ohka Kogyo Co., Ltd.), the relative dielectric constant thereof being 1.9 to 2.2; HSG-6210X (Hitachi Kasei Kogyo Co. Ltd.), the relative dielectric constant thereof being 2.1; and silica aerogel (Kobe Seikousho Co. Ltd.) the relative dielectric constant thereof being 1.1 to 1.4.

As for the porous organic material, specific examples include, for example, P-SiLK (Dow Chemical Co.), the relative dielectric constant thereof being 2.2 to 2.4; and PolyELK (Air Products and Chemicals, Inc.), the relative dielectric constant thereof being 2 or less.

As for the second insulating film 12, it is possible to employ, for example, organic silica glass, organic polymer, HSQ-based materials and MSQ-based materials.

As for the organic silica glass (SiOC), specific examples include, for example, Black Diamond (Applied Materials Inc.), the relative dielectric constant thereof being 2.4 to 3.0; HSG-R7 (Hitachi Chemical Co. Ltd.), the relative dielectric constant thereof being 2.8; p-MTES (Hitachi Kaihatsu Co. Ltd.), the relative dielectric constant thereof being 3.2; CORAL (Novellus Systems Inc.), the relative dielectric constant thereof being 2.4 to 2.7; and Aurora 2.7 (Nippon ESM Co. Ltd.), the relative dielectric constant thereof being 2.7.

As for the organic polymer, specific examples include, for example, SiLK (Dow Chemical Co.), the relative dielectric constant thereof being 2.7; and FLARE, polyaryl ether (PAE)-based material (Honeywell Electronic Materials, Inc.) the relative dielectric constant thereof being 2.8.

As for the HSQ-based materials, specific examples include, for example, OCD T-12 (Tokyo Ohka Kogyo Co.) Ltd.; the relative dielectric constant thereof being 2.9 to 3.4; FOx (Dow Corning Corp.), the relative dielectric constant thereof being 2.9; and OCL T-32 (Tokyo Ohka Kogyo Co., Ltd.), the relative dielectric constant thereof being 2.5.

As for the MSQ-based materials, specific example include, for example, OCD T-9 (Tokyo Ohka Kogyo Co., Ltd.), the relative dielectric constant thereof being 2.7; LKD-T200 (JSR Co., Ltd.), the relative dielectric constant thereof being 2.5 to 2.7; HOSP (Honeywell Electronic Materials, Inc.), the relative dielectric constant thereof being 2.5; and HSG-RZ25 (Hitachi Chemical Co. Ltd.), the relative dielectric constant thereof being 2.5.

By using the aforementioned materials, the second insulating film 12 is formed by a CVD method or coating method. A layer of the SiOC-based material can be formed by the CVD method. For example, a layer of Black Diamond can be formed by the CVD method using a mixed gas comprising trimethyl silane and oxygen, and a layer of p-MTES can be formed by the CVD method using a mixed gas comprising methyltriethoxy silane and $N_2O$.

Because of the fact that it is possible to form a film which is low in relative dielectric constant and sufficiently high in mechanical strength, a material having a methyl group, such as methyl siloxane, is preferable for use for forming the second insulating film 12.

If the interlayer insulating film 17 is constituted by a laminate structure comprising the first insulating film 11 and the second insulating film 12 as shown in FIG. 1, it is possible to sufficiently decrease the dielectric constant of the interlayer insulating film 17 as long as the thickness of the first insulating film 11 is at least 10% of the total film thickness of the laminate structure. However, it is preferable to confine the thickness of the first insulating film 11 to at most about 90% of the total film thickness of the laminate structure. If the thickness of the first insulating film 11 is increased to more than 90% of the total film thickness of the laminate structure, the first insulating film 11 may exposed in the step of CMP, making it difficult to form a wiring. More preferably, the ratio in thickness of the first insulating film 11 should be about 40% to 70% of the total film thickness of the interlayer insulating film 17.

The interlayer insulating film 17 thus formed is subjected to reactive ion etching (RIE) to form a recess, i.e. a wiring trench 13.

Figure 3:
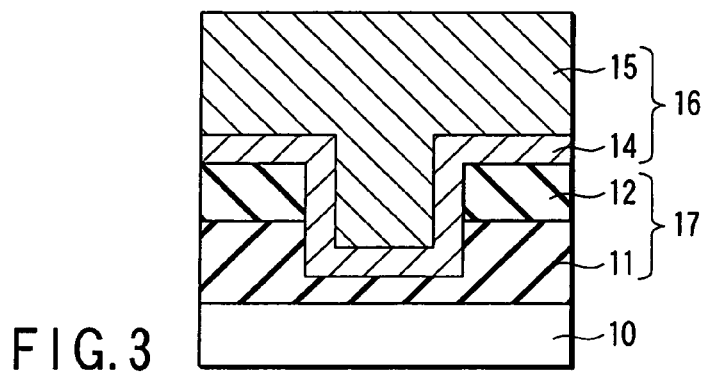
FIG. 3 is a cross-sectional view illustrating the step following the step shown in FIG. 2.

On the interlayer insulating film 17 thus provided with the wiring trench 13 is further deposited with a conductive layer 16 as shown in FIG. 3. In this case, the conductive layer 16 is formed by depositing a wiring material film 15 through an underlying copper diffusion-preventing film 14.

The copper diffusion-preventing film 14 may be formed by, for example, sputtering method using at least one selected from the group consisting of TaN, TaNb, W, WN, TaSiN, Ta, Ti, TiN, TiSiN, Co, Zr, ZrN and CuTa alloy. The copper diffusion-preventing film 14 may be formed of either a single-layer structure or a laminate structure. The thickness of the copper diffusion-preventing film 14 is generally confined within the range of about 2 to 50 nm.

The wiring material film 15 may be formed of Cu or Cu alloy. As for the Cu alloy, it is possible to employ Cu—Si alloy, Cu—Al alloy, Cu—Si—Al alloy, Cu—Ag alloy, etc. This wiring material film 15 can be formed by the sputter deposition method, electrolytic plating method, vacuum deposition method, nonelectrolytic plating, etc. More specifically, Cu or Cu alloy is deposited by the sputtering method or CVD method to form a layer on which copper is further deposited by electrolytic plating to form the wiring material film 15.

Figure 4:
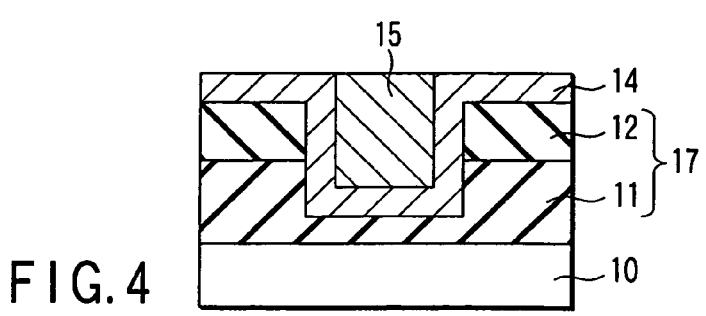
FIG. 4 is a cross-sectional view illustrating the step following the step shown in FIG. 3.
Figure 5:
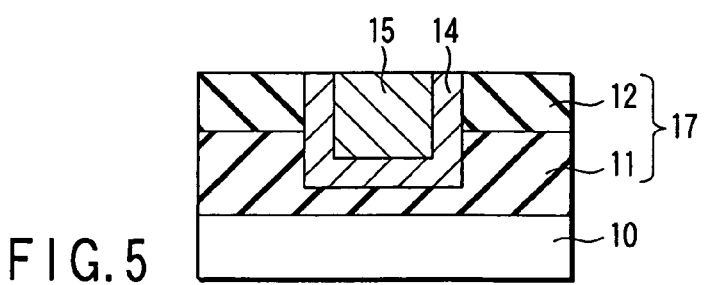
FIG. 5 is a cross-sectional view illustrating the step following the step shown in FIG. 4.
Figure 6:
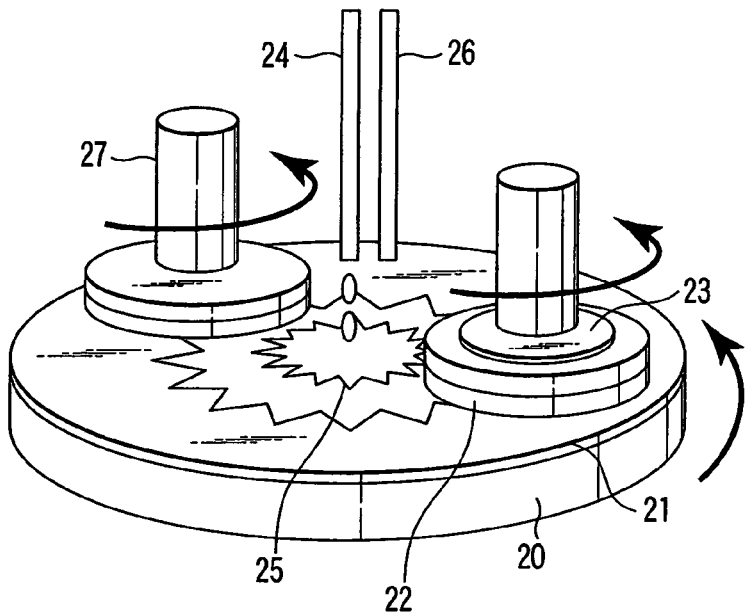
FIG. 6 is a perspective view schematically illustrating a manner of performing CMP.

Redundant portions of the wiring material film 15 are removed to expose the copper diffusion-preventing film 14 as shown in FIG. 4. Then, redundant portions of the copper diffusion-preventing film 14 are removed to expose the second insulating film 12 as shown in FIG. 5. The removal of the redundant portions of the wiring material film 15 and of the copper diffusion-preventing film 14 can be performed by CMP. For example, as shown in FIG. 6, while rotating a turntable 20 having a polishing pad 21 adhered thereto at a predetermined rotational speed, a top ring (a polishing unit) 23 holding a semiconductor substrate 22 is contacted with the polishing pad 21 at a predetermined polishing load. In this case, the top ring 23 is rotated at a predetermined rotational speed and slurry 25 is fed drop-wise from a slurry supply nozzle 24 onto the polishing pad 21. As for the kind of slurry 25, it may be optionally selected depending on the kind of material to be polished. For example, if the wiring material film 15 is to be polished, it is possible to employ an alkaline slurry such as CMS7303/7304 (JSR Co., Ltd.). If a TaN film to be employed as the copper diffusion-preventing film 14 is to be polished, it is possible to employ an alkaline slurry such as CMS8301 (JSR Co., Ltd.). Incidentally, FIG. 6 also shows a washing liquid supply nozzle 26 and a dresser 27.

Figure 7:
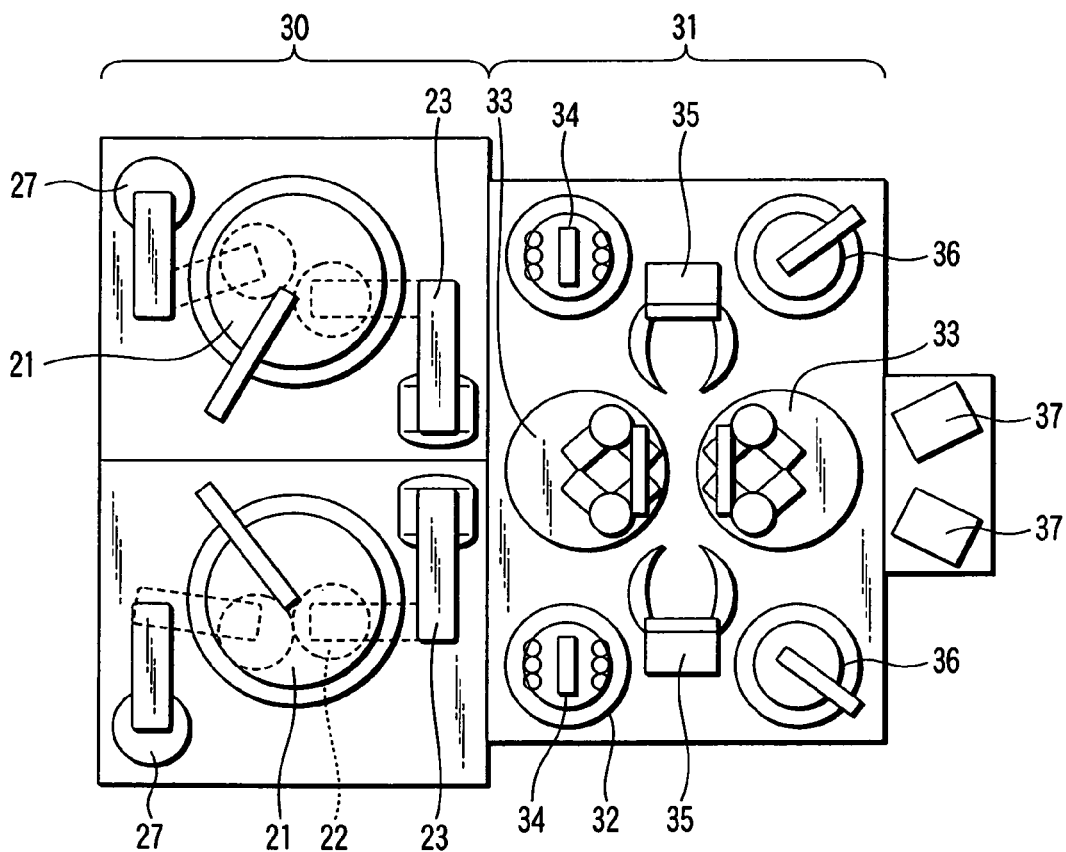
FIG. 7 is a plan view schematically illustrating the construction of a polishing apparatus to be employed in a method according to one embodiment of the present invention.

FIG. 7 schematically illustrates the construction of a polishing apparatus to be employed in a method according to one embodiment of the present invention. The polishing apparatus shown herein represents an ordinary structure and comprises a CMP section 30 where the polishing is performed in a dual system, and a washing section 31 for washing wafers delivered respectively from the CMP section 30. The CMP of the semiconductor substrate 22 is performed, as described above, over the polishing pad 21 located in this CMP section 30, thus leaving the wiring material film 15 in the wiring trench 13 with copper diffusion-preventing film 14 interposed therebetween. The surface of the second insulating film 12 where the conductive layer 16 comprising the copper diffusion-preventing film 14 and the wiring material film 15 is buried is then washed by using a washing liquid containing an inorganic alkali.

The washing of the second insulating film 12 by using a washing liquid containing an inorganic alkali can be performed over the polishing pad 21 which is formed of a resin member. In this case, subsequent to the finish of polishing the copper diffusion-preventing film 14, an alkaline solution is fed as a washing liquid to the polishing pad 21.

More specifically, the washing using an alkaline washing liquid can be performed as follows. Namely, a washing liquid is dropped from a washing liquid supply nozzle 26 shown in FIG. 6 onto the polishing pad 21 and, at the same time, the semiconductor substrate 22 is contacted with the polishing pad 21 while rotating the top ring 23. The load of pressure to be applied on this occasion should preferably be confined within the range of 20 gf/cm$^2$ to 250 gf/cm$^2$. If the load of pressure to be applied is less than 20 gf/cm$^2$, it would be difficult to obtain the merit of enhancing the washing effects that can be derived from the application of pressure load. On the other hand, if the load of pressure to be applied exceeds 250 gf/cm$^2$, the readhesion of washed matters that have been once removed may occur. More preferably, this pressure load should be confined within the range of about 50 gf/cm$^2$ to 200 gf/cm$^2$.

The polishing pad 21 to which the washing liquid is to be applied should preferably be made of polyurethane or polypropylene for instance. It is possible, through the employment of these materials, to suppress the deformation of polishing pad 21 even if pressure is externally applied to the polishing pad 21 and to effectively wash the surface of the second insulating film 12.

After being washed with a washing liquid, the semiconductor substrate 22 is held by a polishing unit 23 and transferred to the washing section 31. In this washing section 31, the wafer hanger (not shown) of a wafer-transferring robot 33 receives the semiconductor substrate 22 from the polishing unit 23 and delivers the semiconductor substrate 22 to a double-roll washing machine 32. The opposite surfaces of semiconductor substrate 22 are then washed with water, etc., as required using the double-roll washing machine 32 and further transferred to a reversing machine 35 by using the wafer-transferring robot 33. The semiconductor substrate 22 thus reversed is then washed and dried using a pencil washing machine 36 before the semiconductor substrate 22 is finally placed in a cassette 37.

Figure 8:
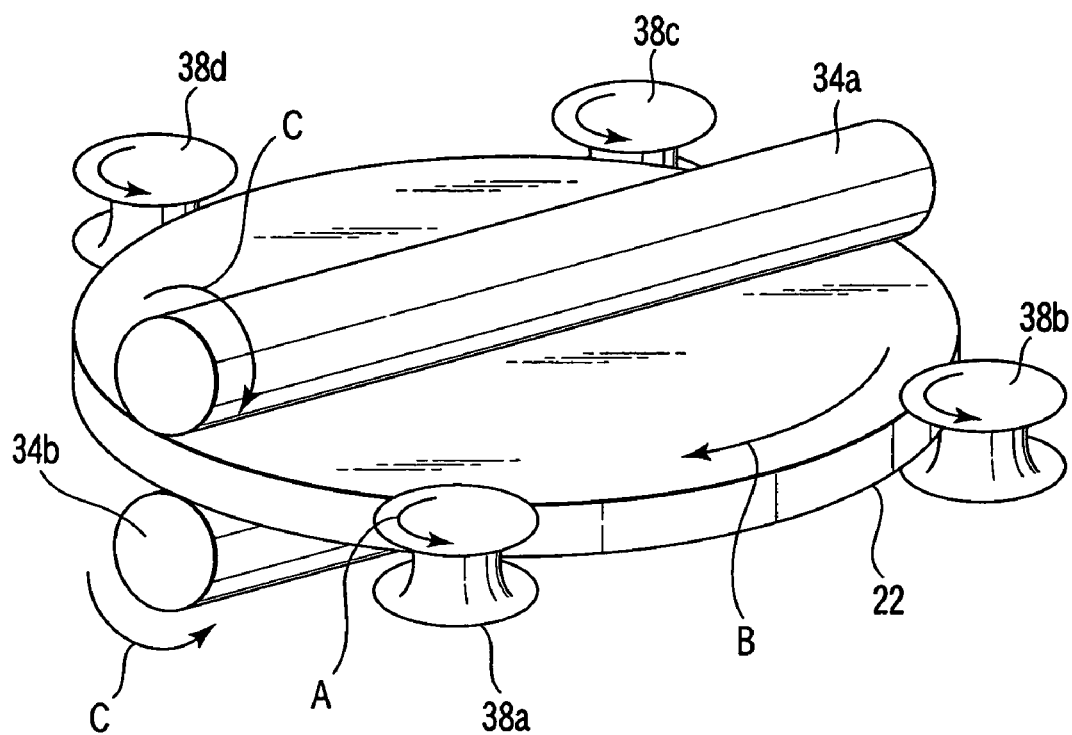
FIG. 8 is a perspective view schematically illustrating a manner of performing roll washing.

After being transferred to the washing section 31, the surfaces of the second insulating film 12 may be washed also with an alkaline washing liquid at the double-roll washing machine 32. After finishing the polishing of the semiconductor substrate 22 by using the polishing pad 21 in the CMP section 30, the semiconductor substrate 22 is held as it is by the polishing unit 23 and transferred to the washing section 31. In this washing section 31, the wafer hanger (not shown) of a wafer-transferring robot 33 receives the semiconductor substrate 22 from the polishing unit 23 and delivers the semiconductor substrate 22 to the double-roll washing machine 32. The manner of roll washing at the double-roll washing machine 32 will be explained with reference to FIG. 8. As shown in FIG. 8, the semiconductor substrate 22 is sustained by a plurality of rollers 38a, 38b, 38c and 38d and caused to rotate in the direction of arrow "B" as these rollers are rotated in the direction of arrow "A". Further, a couple of rolls 34a and 34b are disposed on and contacted with the top and bottom surfaces of the semiconductor substrate 22, respectively, these rolls 34a and 34b being rotated in the direction of arrow "C".

A washing liquid containing an inorganic alkali is dropped from a washing liquid nozzle (not shown) onto the surface of the semiconductor substrate having the insulating film 12 and, at the same time, the surface of the semiconductor substrate 22 is washed by using these rolls 34a and 34b. In the embodiment shown in the drawing, although a couple of rolls 34a and 34b are disposed on the opposite surfaces of the semiconductor substrate 22, respectively, the washing liquid is fed to one of these surfaces of the semiconductor substrate 22. Therefore, the roll which is disposed on the surface of the semiconductor substrate 22 to which the washing liquid is to be fed (for example, the roll 34a) should preferably be constructed such that at least the surface thereof is made of polyurethane or polypropylene. Thus, the roll may be constructed such that it comprises a metallic base body, surface of which is covered with any of these resins. In the same manner as in the case of the aforementioned polishing pad, the roll should preferably be rotated while press-contacting it with the surface of the semiconductor substrate 22 at a load ranging from 20 gf/cm$^2$ to 250 gf/cm$^2$.

Incidentally, the roll disposed on the other side of the semiconductor substrate 22 (for example, the roll 34b) is employed for removing the residual slurry or dusts adhering on the rear surface of the semiconductor substrate 22. This roll may be constituted by polyvinyl alcohol, etc., other than polyurethane and polypropylene. Further, as for the pressure load to be applied to this roll, there is not any particular limitation and therefore the pressure load to be applied to this roll may be optionally selected from the range from 5 gf/cm$^2$ to 1000 gf/cm$^2$.

After being washed with an alkaline washing liquid, the semiconductor substrate 22 may be washed again with water, etc., if required. After being roll-washed using the double-roll washing machine 32, the semiconductor substrate 22 is delivered, in the same manner as described above, to the reversing machine 35 by using the wafer-transferring robot 33. The semiconductor substrate 22 thus reversed is then washed and dried using a pencil washing machine 36 before the semiconductor substrate 22 is finally placed in a cassette 37.

In the polishing apparatus as shown in FIG. 7, the polish-washing that can be performed through the sliding between the polishing pad and the semiconductor substrate in the CMP section 30 and the roll-washing in the washing section 31 may not necessarily be performed concurrently, but it is required to perform at least one of these washing methods. When both of these washing methods are concurrently performed however, the effect of washing the surface of the second insulating film 12 can be further enhanced.

As for the inorganic alkali to be included in the washing liquid, it is possible to employ at least one selected from the group consisting of potassium hydroxide, calcium hydroxide, magnesium hydroxide and sodium hydroxide. Among these hydroxides, potassium hydroxide is most preferable because of the fact that damages to the surface of a metallic film such as a wiring material film can be minimized. In this case, the concentration of the inorganic alkali in the washing liquid should preferably be confined within the range of about 0.05 wt % to 5 wt %. If this concentration is less than 0.05 wt %, it may become difficult to sufficiently obtain the effects expected of the inorganic alkali. On the other hand, even if the inorganic alkali is added exceeding 5 wt %, it would be impossible to expect any further enhancement of effects.

The following facts have been found out by the present inventors. Namely, when the surface of second insulating film 12 is washed in an alkaline region subsequent to the polishing of the surface of second insulating film 12 with an alkaline slurry, the surface of second insulating film 12, which is hydrophobic, can be turned into hydrophilic surface. As a result, it is possible to enhance the washing capability without generating defects such as water glass. Water glass herein means a circular defect containing impurities such as Si and Cu. Conventionally, it has been considered difficult to prevent the generation of water glass, thus leading to the deterioration of yield. It has been made clear by the present inventors that the cause for the generation of water glass can be ascribed to the fact that since the washing has been conventionally performed in an acidic region, it is impossible to convert the hydrophobic surface of insulating film into hydrophilic surface, thereby generating water glass. Even if the hydrophobic surface of insulating film is washed with pure water after finishing the polishing of the insulating film with an alkaline slurry, the hydrophobic surface of insulating film cannot be converted into hydrophilic surface since the pH of washing liquid is neutral.

The washing liquid may contain an organic acid such as multivalent carboxylic acids or salts thereof. When an organic acid is included in the washing liquid, the washing effect of the washing liquid can be enhanced. As for the multivalent carboxylic acids, it is possible to employ at least one selected from the group consisting of oxalic acid, citric acid, malonic acid, succinic acid, glutaric acid, adipic acid, pimelic acid, maleic acid, fumaric acid, phthalic acid, malic acid, tartaric acid, and quinaldinic acid. Among them, the employment of oxalic acid and citric acid is preferable, since they are low in price, high in safety and proven results of washing. If an organic acid is included in the washing liquid at a concentration ranging from 0.05 wt % to 2 wt %, it is possible to expect sufficient effects of the organic acid.

The washing liquid may contain a nonionic surfactant. The addition of a nonionic surfactant is useful in preventing the readhesion of washed matters that have been once removed. Preferable examples of the nonionic surfactant are those containing, as a major component, polyacrylate or polycarboxylate and having a weight average molecular weight of 10000 or less. It is possible to expect sufficient effects of the nonionic surfactant, as long as the concentration of the nonionic surfactant in the washing liquid is confined within the range of 0.05 wt % to 2 wt %.

In the foregoing description, although the method according to one embodiment of the present invention has been explained with reference to the formation of buried wiring, the method of the present invention is also applicable to the formation of plug.

Next, one embodiment of the present invention will be explained in detail with reference to specific example.

150 nm in thickness of P-SiLK as the first insulating film 11 and 150 nm in thickness of Black Diamond as the second insulating film 12 were successively deposited on the semiconductor substrate 10 to form an interlayer insulating film 17. Then, by RIE, a wiring trench 13 having a depth of 200 nm and a width of 80 nm was formed in the interlayer insulating film 17. Further, by sputtering method, 20 nm in thickness of a TaN film as the copper diffusion-preventing film 14 was deposited on the entire surface of the semiconductor substrate 10. Thereafter, by plating method, 800 nm in thickness of a Cu film as the wiring material film 15 was deposited on the copper diffusion-preventing film 14 to form a conductive layer 16 as shown in FIG. 3.

Redundant portion of the copper diffusion-preventing film 14 and the wiring material film 15 was removed by using EPO-222 (EBARA CORPORATION Ltd.) as a CMP apparatus.

The polishing of the wiring material film 15 was performed using IC1000 (Rodel Nitta Co., Ltd.) as a polishing pad as explained below. Namely, as shown in FIG. 6, a turntable 20 having the polishing pad 21 attached thereto was rotated at a rotational speed of 100 rpm, and, at the same time, a top ring 23 holding the semiconductor substrate 22 was contacted with the polishing pad 21 at a polishing load of 300 gf/cm$^2$.

The rotational speed of the top ring 23 was set to 100 rpm, and CMS7303/7304 (JSR Co., Ltd.) as the slurry 25 was fed drop-wise from a slurry supply nozzle 24 to the polishing pad 21 at a flow rate of 250 cc/min.

The polishing of the wiring material film 15 was performed for two seconds under the aforementioned conditions to expose the surface of the copper diffusion-preventing film 14 as shown in FIG. 4 and then second polishing was performed under the following conditions.

Namely the second polishing was performed for one minute under the same conditions as described above except that CMS8301 (JSR Co., Ltd.) as a slurry was fed drop-wise to the polishing pad 21 at a flow rate of 200 cc/min, thereby exposing the surface of the second insulating film 12 as shown in FIG. 5. When the surface of the second insulating film 12 that has been polished was observed by using a defect-assessment apparatus (KLA-Tencor Co.), the presence of residual dusts was recognized.

Subsequently, a washing liquid was fed from a washing liquid supply nozzle 26 to the polishing pad 21 to perform the washing under the following conditions. The semiconductor substrate 22 was press-contacted with the polishing pad 21 at a load of 200 gf/cm$^2$ and the washing liquid was fed drop-wise to the polishing pad 21 at a flow rate of 200 cc/min. The turntable 20 and the top ring 23 were both rotated at a rotational speed of 100 rpm, and the washing was continued for 30 seconds.

By using various kinds of aqueous solution of potassium hydroxide each differing in pH value as a washing liquid, the washing of the second insulating film 12 was performed respectively. In this case, potassium hydroxide was added to the washing liquid so as to obtain a predetermined pH. The concentration of potassium hydroxide in the aqueous solution was confined within the range of 0.05 wt % to 5 wt % in all of these washing liquids. After finishing the washing of second insulating film 12, the surface of the second insulating film 12 was examined by using a defect-assessment apparatus (KLA-Tencor Co.) to investigate the defects on the surface of second insulating film 12, the results being summarized together with yield in the following Table 1. Incidentally, the defect herein means dust and water glass.

TABLE 1

| pH | Number of defects/cm$^2$ | Yield (%) |
|---|---|---|
| 9 | 83 | 76 |
| 10 | 3 | 89 |
| 11 | 2 | 90 |
| 12 | 3 | 92 |
| 13 | 2 | 90 |
| 14 | 22 | 80 |

As long as the number of defects on the surface of insulating film 12 is confined to 20 defects/cm$^2$ or less, the performance of semiconductor device would not be substantially affected by the defect. The yield should desirably be at least 80%. In the case where Black Diamond was employed as the second insulating film 12, it was possible to satisfy the aforementioned requirements by confining the pH of the washing liquid to the range of more than 9 and less than 14, e.g. the range of 10 to 13. When the pH of the washing liquid is 14 or in a strong alkaline region, the surface of Cu film would be susceptible to damage. The same tendency like this was recognized also in the employment of other kinds of metallic film. Further, after finishing the washing using any one of these washing liquids, the second insulating film 12 was immersed in pure water for 30 seconds and then visually determined based on the criterion that if the surface of second insulating film 12 was kept wet for 10 seconds after the second insulating film 12 was pulled out of the pure water, the surface of second insulating film 12 was determined as hydrophilic. As a result, it was confirmed that when the pH of the washing liquid is confined to 10 or more, it was possible to convert the surface of Black Diamond employed as the second insulating film 12 into hydrophilic surface. It is assumed that even if a washing liquid containing other kinds of inorganic alkali is employed, almost the same results as described above can be obtained.

Then, an organic acid or a nonionic surfactant was added to the inorganic alkaline solution to prepare a washing liquid, which was then employed in the same manner as described above for washing the surface of second insulating film 12, the surface thus washed being subsequently investigated in the same manner as described above. For the purpose of comparison, an aqueous solution of citric acid, i.e., an acidic solution, and an aqueous solution of tetramethyl ammonium hydroxide (TMAH), i.e., an organic alkali, were employed for washing the surface of second insulating film 12 in the same manner as described above, the results being summarized in the following Table 2. Table 2 also shows the results obtained through the employment of an aqueous solution of KOH exhibiting a pH of 11. The concentration of potassium hydroxide in the aqueous solution of inorganic alkali was all confined within the range of 0.05 wt % to 5 wt %.

TABLE 2

| | pH | Number of defects/cm$^2$ | Yield (%) |
|---|---|---|---|
| KOH | 11 | 2 | 90 |
| KOH + Citric acid (0.2 wt %) | 10.5 | 0 | 96 |
| KOH + Citric acid (2 wt %) | 10.5 | 1 | 94 |
| KOH + Oxalic acid (0.2 wt %) | 10.5 | 0 | 94 |
| KOH + Nonion (0.2 wt %) | 10.5 | 0 | 95 |
| Citric acid (0.2 wt %) | 2.5 | 113 | 80 |
| Citric acid (2 wt %) | 2 | 165 | 82 |
| TMAH (0.2 wt %) | 10.5 | 256 | 74 |

It will be recognized from the results shown in Table 2 that it was possible, through the employment of an aqueous solution of an inorganic alkali containing an organic acid or a nonionic surfactant, to further reduce the number of defects and to enhance the yield. In the case of an aqueous solution of citric acid or an aqueous solution of an organic alkali, it was impossible to reduce the number of defects and the yield was limited to at most 82%. It was confirmed, through the dipping experiment performed in the same manner as described above, that in the case where an aqueous solution of citric acid was employed, the surface of the second insulating film 12 after the aforementioned washing was hydrophobic.

Subsequently, the effects of roll washing were also investigated. An aqueous solution of KOH (pH=10.5) containing 0.2 wt % of oxalic acid was prepared as a washing liquid. The concentration of KOH in the aqueous solution was confined within the range of 0.05 wt % to 5 wt %. First of all, after finishing the second polishing in the same manner as described above, the substrate was subjected to washing by feeding the washing liquid thereto at a flow rate of 200 cc/min. As for the polishing pad, IC1000 (Rodel Nitta Co., Ltd.) was employed. A semiconductor substrate was press-contacted with this polishing pad at a polishing load of 200 gf/cm². The turntable and the top ring were all rotated at a rotational speed of 100 rpm to perform the washing for 30 seconds.

Subsequent to the washing using a polishing pad, roll washing was performed as shown in FIG. 8 using a roll made of polypropylene and the same kind of washing liquid as described above. The surface of the second insulating film 12 thus washed was investigated, the results being summarized in the following Table 3.

The results obtained from the washing of the second insulating film 12 which was performed in the same manner as described above except that pure water or oxalic acid was employed as a roll washing liquid are also shown in the following Table 3.

TABLE 3

| Roll washing liquid | pH | Number of defects/cm² | Yield (%) |
|---|---|---|---|
| Pure water | 7 | 0 | 94 |
| KOH + Oxalic acid (0.2 wt %) | 10.5 | 0 | 99 |
| Oxalic acid (0.2 wt %) | 2.5 | 2 | 92 |

It was confirmed that it was possible, through the employment of an aqueous solution of an inorganic alkali as a washing liquid and through the execution of not only the polish washing but also the roll washing, to further enhance the yield without generating defects at all. As shown in Table 3, once the polish washing using an aqueous solution of an inorganic alkali was finished, the effects mentioned above would not be badly affected even if pure water or an aqueous solution of acid was employed as a roll washing liquid.

Further, the influence of the pressure of load on the washing was investigated. An aqueous solution of KOH (pH=11) was prepared as a washing liquid. The concentration of potassium hydroxide in the aqueous solution was confined within the range of 0.05 to 5 wt %. After finishing the second polishing in the same manner as described above, the substrate was subjected to washing by feeding the washing liquid thereto at a flow rate of 200 cc/min. As for the polishing pad, IC1000 (Rodel Nitta Co., Ltd.) was employed. The turntable and the top ring were all rotated at a rotational speed of 100 rpm to perform the washing for 30 seconds. The pressure load was variously varied in the washing and then the polished surface of the second insulating film 12 was investigated. The results thus obtained are summarized together with the yield in the following Table 4. Incidentally, a load of 0 gf/cm² was achieved by adsorbing the semiconductor substrate onto the top ring.

TABLE 4

| Load (gf/cm²) | Number of defects/cm² | Yield (%) |
|---|---|---|
| 0 | 620 | 62 |
| 20 | 12 | 80 |
| 50 | 7 | 84 |
| 100 | 5 | 88 |
| 150 | 3 | 90 |
| 200 | 2 | 90 |
| 250 | 8 | 89 |
| 300 | 68 | 76 |

As shown in Table 4, when the washing was performed with application of no load, a large number of defects, i.e. 620 defects/cm² was recognized. The reason for this seems to be ascribed to the fact that the washing effect was not exhibited at all. On the other hand, when the washing was performed with a load as high as 300 gf/cm², the readhesion of washed matters that had been once removed was caused to occur, thereby making it impossible to reduce the number of defects. As long as the load was confined within the range of 20 to 250 gf/cm², it was possible to confine the number of defects and the yield within an acceptable range. The results shown in Table 4 indicates that the load should preferably be confined within the range of 50 to 200 gf/cm².

In the foregoing examples, the present invention has been explained with reference to an interlayer insulating film constituted by a laminate structure comprising P-SiLK as a first insulating film, and Black Diamond as a second insulating film, the present invention should not be construed as being limited by such an interlayer insulating film. For example, Black Diamond may be deposited to a thickness ranging from 100 to 600 nm to constitute the interlayer insulating film by using a single layer of the second insulating film.

According to one aspect of the present invention, it is possible to provide a method which makes it possible to manufacture a semiconductor device having a conductive material buried in a low dielectric constant insulating film at a high yield while suppressing the generation of defects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

forming a hydrophobic interlayer insulating film having a relative dielectric constant of 3.5 or less above a semiconductor substrate;

forming a recess in the interlayer insulating film;

depositing a conductive material above the interlayer insulating film having the recess to form a conductive layer;

selectively removing the conductive material deposited above the interlayer insulating film by polishing with an alkaline slurry to expose a surface of the interlayer insulating film while leaving the conductive material in the recess; and subjecting the surface of the interlayer insulating film having the recess filled with the conductive material to pressure washing using a resin member and an alkaline washing liquid containing a mixture of an organic acid and an inorganic alkali and exhibiting a pH of more than 9.

2. The method according to claim 1, wherein an aqueous solution having a pH of more than 9 and less than 14 is employed as the alkaline washing liquid.

3. The method according to claim 1, wherein the pressure washing is performed by press-contacting the interlayer insulating film having the conductive material buried therein with the resin member at a pressure ranging from 20 to 250 gf/cm².

4. The method according to claim 1, wherein the resin member comprises polyurethane or polypropylene.

5. The method according to claim 1, wherein the alkaline washing liquid further comprises a nonionic surfactant.

6. The method according to claim 1, wherein the surface of the interlayer insulating film becomes hydrophilic by pressure washing.

7. The method according to claim 1, wherein selectively removing the conductive material is performed by contacting the semiconductor substrate having the conductive layer formed thereabove with a polishing pad, and the pressure washing is performed by slide-contacting the surface of the interlayer insulating film having the recess filled with the conductive material with the polishing pad while pressing the semiconductor substrate against the polishing pad and feeding the alkaline washing liquid to the polishing pad.

8. The method according to claim 1, wherein selectively removing the conductive material is performed by contacting the semiconductor substrate having the conductive layer formed thereabove with a polishing pad, and the resin member is a roll having at least resinous surface.

9. The method according to claim 1, wherein the inorganic alkali comprises at least one selected from the group consisting of potassium hydroxide, calcium hydroxide, magnesium hydroxide and sodium hydroxide.

10. The method according to claim 1, wherein the inorganic alkali is included in the alkaline washing liquid at a concentration ranging from 0.05 to 5 wt %.

11. The method according to claim 1, wherein the organic acid is selected from the group consisting of oxalic acid, citric acid, malonic acid, succinic acid, glutaric acid, adipic acid, pimelic acid, maleic acid, fumaric acid, phthalic acid, malic acid, tartaric acid, and quinaldinic acid.

12. A method for manufacturing a semiconductor device comprising:
    forming a hydrophobic interlayer insulating film having a relative dielectric constant of 3.5 or less above a semiconductor substrate;
    forming a recess in the interlayer insulating film;
    depositing a conductive material above the interlayer insulating film having the recess to form a conductive layer;
    contacting the semiconductor substrate having the conductive layer formed thereabove with a polishing pad which is formed of a resin member, thereby selectively removing the conductive material deposited above the interlayer insulating film by polishing with an alkaline slurry, thus exposing a surface of the interlayer insulating film while leaving the conductive material in the recess; and
    slide-contacting the surface of the interlayer insulating film having the recess filled with the conductive material with the polishing pad while pressing the semiconductor substrate against the polishing pad and feeding an alkaline solution containing an inorganic alkali and exhibiting a pH of more than 9 to the polishing pad.

13. The method according to claim 12, wherein an aqueous solution having a pH of more than 9 and less than 14 is employed as the alkaline solution.

14. The method according to claim 12, wherein the inorganic alkali comprises at least one selected from the group consisting of potassium hydroxide, calcium hydroxide, magnesium hydroxide, and sodium hydroxide.

15. The method according to claim 12, wherein the inorganic alkali is included in the alkaline solution at a concentration ranging from 0.05 wt % to 5 wt %.

16. The method according to claim 12, wherein the semiconductor substrate is pressed against the polishing pad at a pressure ranging from 20 to 250 gf/cm$^2$.

17. The method according to claim 12, wherein the alkaline solution further comprises an organic acid.

18. The method according to claim 17, wherein the organic acid is selected from the group consisting of oxalic acid, citric acid, malonic acid, succinic acid, glutaric acid, adipic acid, pimelic acid, maleic acid, fumaric acid, phthalic acid, malic acid, tartaric acid, and quinaldinic acid.

19. The method according to claim 12, further comprising, after slide-contacting the surface of the interlayer insulating film with the polishing pad, subjecting the interlayer insulating film to pressure washing by using a roll having at least resinous surface while feeding an alkaline washing liquid containing an inorganic alkali and exhibiting a pH of more than 9 to the surface of the interlayer insulating film.

* * * * *